US005521994A

United States Patent [19]
Takeuchi et al.

[11] Patent Number: 5,521,994
[45] Date of Patent: May 28, 1996

[54] SEMICONDUCTOR OPTICAL WAVEGUIDE-INTEGRATED LIGHT-RECEIVING DEVICE

[75] Inventors: Takeshi Takeuchi; Kenko Taguchi; Keiro Komatsu; Masako Yamamoto; Kiichi Hamamoto, all of Tokyo, Japan

[73] Assignee: NEC Corporation, Tokyo, Japan

[21] Appl. No.: 478,840

[22] Filed: Jun. 7, 1995

[30] Foreign Application Priority Data

Jun. 29, 1994 [JP] Japan .................................. 6-146894

[51] Int. Cl.⁶ ...................................................... G02B 6/12
[52] U.S. Cl. ........................................................... 385/14
[58] Field of Search ............................... 257/14, 432, 457, 257/466, 458, 459, 461, 615; 372/46, 50, 45, 19, 32, 49; 385/14, 122, 147, 30, 130

[56] References Cited

U.S. PATENT DOCUMENTS

| 4,893,313 | 1/1990 | Genichih et al. | 372/46 |
| 5,054,871 | 10/1991 | Deri et al. | 385/30 |
| 5,111,469 | 5/1992 | Narui et al. | 372/46 |
| 5,121,182 | 6/1992 | Kuroda et al. | 257/432 |
| 5,252,852 | 10/1993 | Makiuchi et al. | 257/458 |
| 5,321,779 | 6/1994 | Kissa | 385/14 |
| 5,331,659 | 7/1994 | Ohata et al. | 372/50 |

FOREIGN PATENT DOCUMENTS

4-243216  8/1992  Japan .

*Primary Examiner*—Akm E. Ullah
*Attorney, Agent, or Firm*—Sughrue, Mion, Zinn, Macpeak & Seas

[57] ABSTRACT

Disclosed herein is a semiconductor optical waveguide-integrated light-receiving device comprising a waveguide-type photodetector and a passive optical waveguide which are selectively formed on the same substrate, wherein the width of mask for a selective growth is varied along the waveguiding direction so as to simultaneously form core layers which differ from each other in absorption edge wavelength. The core layer may be formed with an MQW layer. It is also featured that waveguide width of the photodetector is made larger than the waveguide width of the optical waveguide. The photodetector and the optical waveguide may be buried by an n—InP layer.

12 Claims, 8 Drawing Sheets

SEMICONDUCTOR OPTICAL WAVEGUIDE-INTEGRATED LIGHT-RECEIVING DEVICE

BACKGROUND OF THE INVENTION

1. Field of the Invention

This invention relates to a semiconductor optical integrated device, and in particular to a monolithic waveguide-type photodiode optical detector.

2. Description of the Prior Art

In the use of an optical communication receiver having a directional coupler/waveguide as a constitutional element, for example, an optical heterodyne receiver or an optical wavelength division multiplexing detector, it is very important to develop a suitable optical coupling technique to connect a single mode optical waveguide and a photodiode. If it is desired to monolithically integrate a single-mode optical waveguide constituted by a semiconductor together with a waveguide-type photodiode on the same substrate, it is required to form the core layer of the optical waveguide with a material which is different in absorption edge wavelength from a material of the light-absorbing layer of the photodiode so that the optical waveguide exhibits an excellent optical waveguiding performance without causing any serious optical absorption loss, and so that the optical absorption layer of the photodiode has a sufficient degree of absorption coefficient.

Figure 1A:
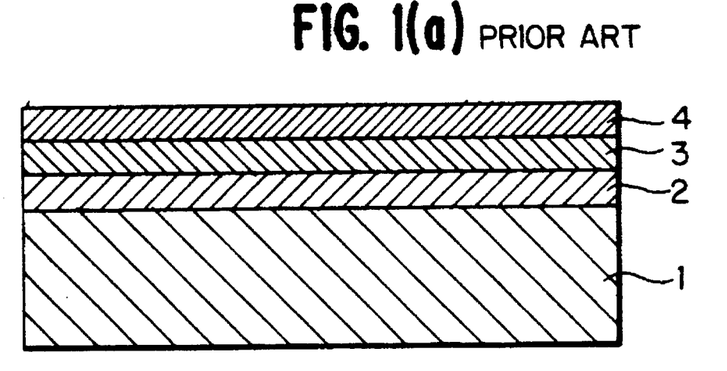
FIG. 1(a), FIG. 1(b) and FIG. 1(c) show sectional views of the device taken along the waveguiding direction of light explaining the manufacturing steps.
Figure 1B:
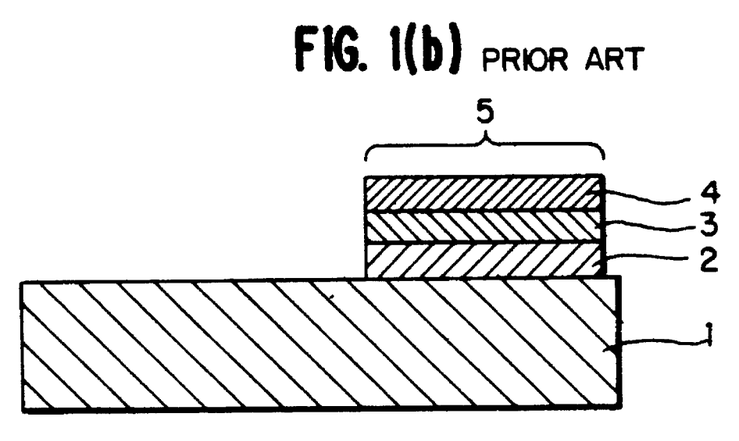
Figure 1C:
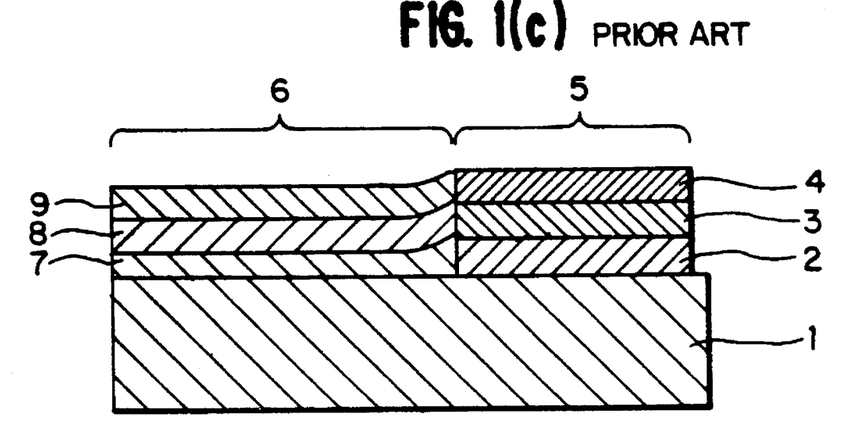

One example of the conventional integrated optical device comprising an optical waveguide and a waveguide-type photodiode will be explained with reference to FIG. 1(a), FIG. 1(b) and FIG. 1(c). In FIGS. 1(a)–(c), main manufacturing steps of the integrated device are shown by the cross-section taken along the waveguiding direction of light. First, as shown in FIG. 1(a), crystal layers to constitute a photodiode, i.e. an $n^+$-InP buffer layer 2, an $n^-$-InGaAs light-absorption layer 3 and a $p^+$-InP contact layer 4 are grown in the mentioned order all over the upper surface of an n-type InP substrate 1.

Then, as shown in FIG. 1(b), these crystal layers are etched off except for an island region which serves as a photodiode 5. Subsequently, as shown in FIG. 1(c), an $n^-$-InP lower clad layer 7, an $n^-$-InGaAsP core layer 8 and an $n^-$-InP upper clad layer 9 are selectively regrown in the mentioned order only on the optical waveguide region of the n-type InP substrate 1. By employing this fundamental structure, or if desired, by further performing a step of burying the optical waveguide region with InP, the integrated device of the prior art can be obtained after performing ordinary manufacturing steps such as a step of forming electrodes. This conventional integrated device is featured in that the optical waveguide and photodiode are optically coupled through the regrowth interface in the so-called butt-coupling manner.

Figure 2A:
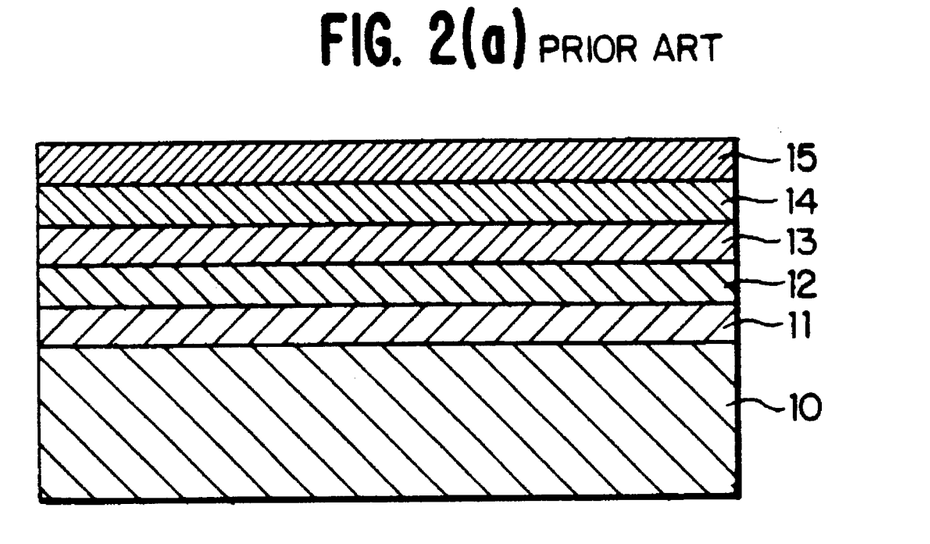
FIG. 2(a) and FIG. 2(b) show sectional views of the device taken along the waveguiding direction of light explaining the manufacturing steps.

Another example of the conventional integrated device of an optical waveguide and a waveguide-type photodiode will be explained with reference to FIGS. 2(a)–2(c). In these figures, main manufacturing steps of the integrated devices are shown also by the cross-section taken along the waveguiding direction of light. First, as shown in FIG. 2(a), crystal layers for an optical waveguide, i.e. an $n^-$-InP lower clad layer 11, an $n^-$-InGaAsP core layer 12 and an $n^-$-InP upper clad layer 13, and crystal layers for a photodiode, i.e. an $n^-$-InGaAs light-absorption layer 14 and a $p^+$-InP contact layer 15 are grown in the mentioned order all over the upper surface of an n-type InP substrate 10.

Figure 2B:
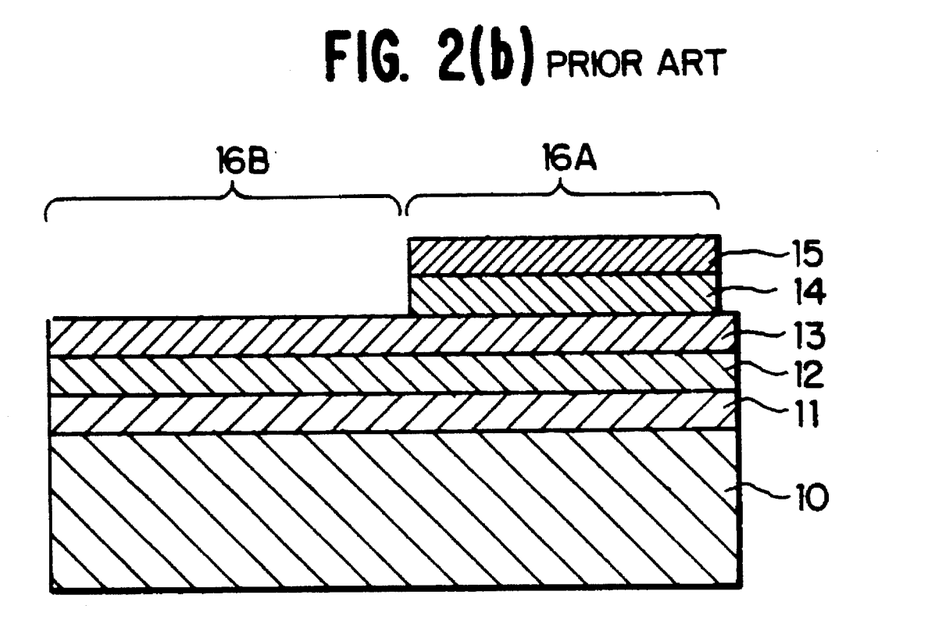

Then, as shown in FIG. 2(b), the $n^-$-InGaAs light-absorption layer 14 and the $p^+$-InP contact layer 15 are etched off except for an island region which serves as a photodiode 16A. Subsequently, the $n^-$-InP upper clad layer 13 in the optical waveguide region 16B is shaped into a ridge through an spatially selective etching process so as to form an optical waveguide. Then the resultant structure is further processed by the ordinary manufacturing steps such as a step of forming electrodes, thus finally accomplishing the integrated device. This conventional integrated device is featured in that the optical waveguide and photodiode are optically coupled through a so-called evanescent field coupling scheme. These are examples of a photodiode integrated with a single-mode optical waveguide.

According to the conventional integrated device shown in FIG. 1, a regrown interface is introduced at the butt-coupling portion between the optical waveguide and the photodiode, thus giving rise to a large discontinuity in electric field distribution of the guided mode and scattering and reflection of incident light in the vicinity of this regrowth interface, thereby setting forth a problem of lowering coupling efficiency between the optical waveguide and the photodiode. Moreover, since the crystal layers for the photodiode are grown separately from the layers for the optical waveguide, at least two crystal growth processes are required thus complicating the manufacturing process and increasing the number of process steps In the conventional integrated device shown in FIG. 2, since the optical waveguide and the photodiode are optically coupled through evanescent field coupling, the confinement of light within the light absorbing layer is rather weak, so that in order to attain a sufficient quantum efficiency, a length of several hundreds microns in the optical waveguiding direction is generally required for the photodiode portion. Due to this reason, it is impossible to design a compact device, and the resultant enlargement in the diode area causes increases in both device capacity and dark current, thereby deteriorating the performance of the device.

SUMMARY OF THE INVENTION

Accordingly, the object of the present invention is to provide a semiconductor optical waveguide-integrated light-receiving device which is free from the problems as mentioned above.

Namely, according to the present invention, there is provided a semiconductor optical waveguide-integrated light-receiving device comprising a semiconductor multilayered structure of a semiconductor core layer and a semiconductor clad layer laminated in the mentioned order on a semiconductor substrate, and constructed such that a waveguide-type light-receiving device is connected to a distal end of a passive waveguide, which is characterized in that an optical waveguide is continuously formed without said semiconductor core layer being interrupted at the connecting portion between the passive waveguide and the waveguide-type light-receiving device, and that an absorption edge-wavelength (sometimes called 'band-gap wavelength') of the semiconductor core layer of the passive waveguide is made shorter than the absorption edge wavelength of the light-receiving device.

According to the present invention, there is further provided a semiconductor optical waveguide-integrated light-receiving device wherein the width of waveguide of the light-absorbing layer is made wider than that of an optical waveguide layer in order to photoelectrically convert light introduced into the light-absorbing region into electron-hole pairs with high efficiency.

Also according to the present invention, there is further provided a semiconductor optical waveguide-integrated light-receiving device wherein the pn junction of the light-receiving region is selectively formed in order to prevent a waveguide loss due to an introduction of a high concentration layer into the waveguide structure.

BRIEF DESCRIPTION OF THE DRAWINGS

The above and other objects, advantages and features of the present invention will be more apparent from the following description, taken in conjunction with the accompanying drawings in which;

FIG. 1 explains one example of the conventional integrated device, wherein

FIG. 2 explains another example of the conventional integrated device, wherein

FIG. 3 explains a first embodiment of this invention, wherein

FIG. 6 explains a fourth embodiment of this invention, wherein

FIG. 7 explains a fifth embodiment of this invention, wherein

FIG. 8 explains a fifth embodiment of this invention, wherein

DESCRIPTION OF THE PREFERRED EMBODIMENTS

This invention will be further explained with reference to embodiments shown in the drawings as follows. FIG. 3 shows schematically a manufacturing process of a semiconductor optical waveguide-integrated light-receiving device according to a first embodiment of this invention, wherein FIG. 3(a) is a plan view showing a top surface of the device, FIG. 3(b) and FIG. 3(c) are both sectional views perpendicularly crossing the optical waveguide, showing a sectional view of the optical. waveguide region, and the photodiode region, respectively, and FIG. 3(d) is a perspective view of an external appearance of the accomplished device.

Figure 3A:
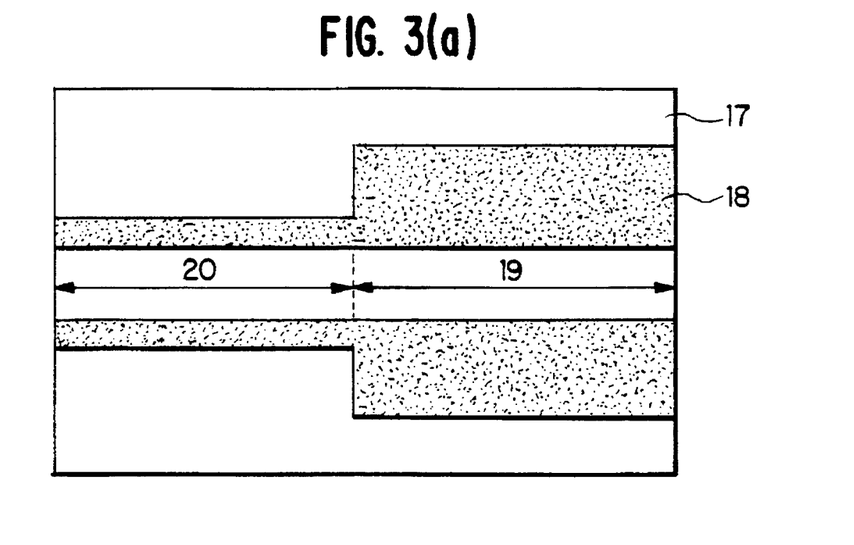
FIG. 3(a) shows a mask pattern for a selective growth.

Referring first to FIG. 3(a), a stripe-patterned mask consisting of a $SiO_2$ film 18 for selective growth is formed on an n-type InP substrate 17 having a (001) azimuthal plane as its main surface. The direction of the stripe, i.e., the waveguiding direction, is [110] for both an optical waveguide portion 20 and an adjacent photodiode portion 19. As seen from FIG. 3(a), the width of the mask pattern on the photodiode portion 19 is made larger than the mask pattern on the optical waveguide portion 20, while the width of the striped opening is made constant. Then, through a selective growth technique such as Metal-Organic Vapor Phase Epitaxy, an $n^+$-InP lower clad layer 21 (carrier concentration: $1\times10^{18}$ cm$^{-3}$), an $n^-$-InGaAsP layer 22 ($2\times10^{15}$ cm$^3$) and a $p^+$-InP upper clad layer 23 ($1\times10^{18}$ cm$^{-3}$) are formed. In this case, the composition as well as the thickness of the $n^-$-InGaAsP layer 22 formed on the photodiode portion 19 differs from that on the optical waveguide portion 20. This is considered to be due to difference in diffusion of atoms or molecules that could not grow on the mask,. i.e., mass transport effects (c.f. Japanese Patent Unexamined Publication H4-243216).

Figure 3B:
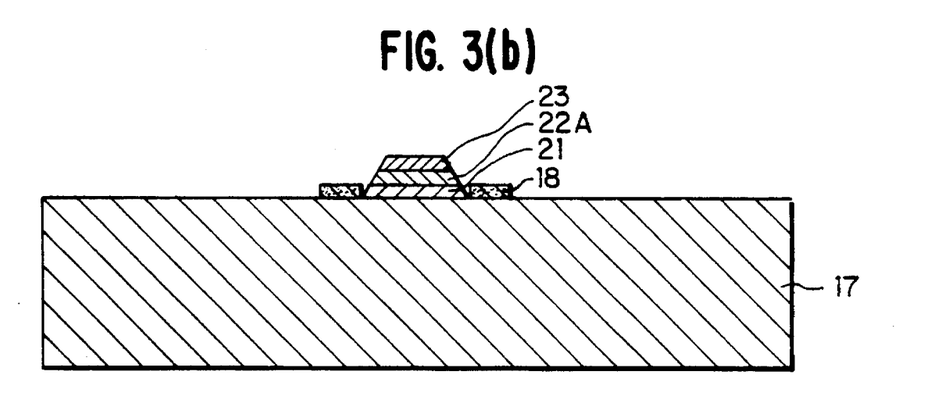
FIG. 3(b) shows a sectional view of an optical waveguide portion.
Figure 3C:
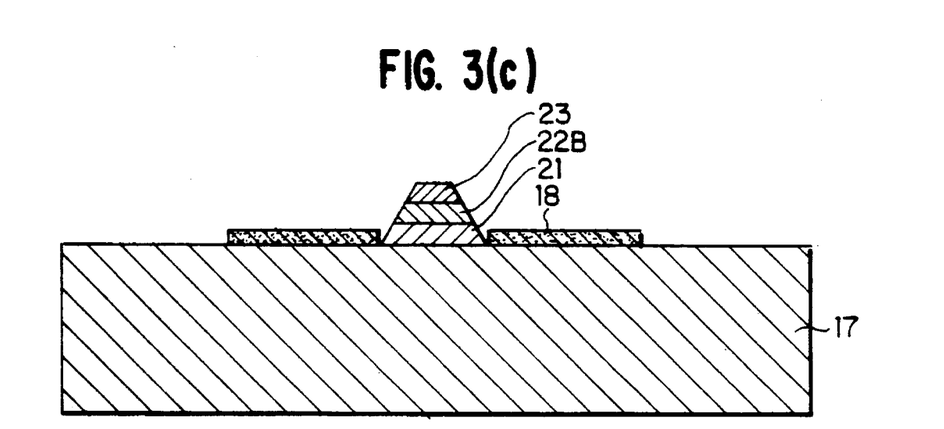
FIG. 3(c) shows a sectional view of a photodiode portion of an device.
Figure 3D:
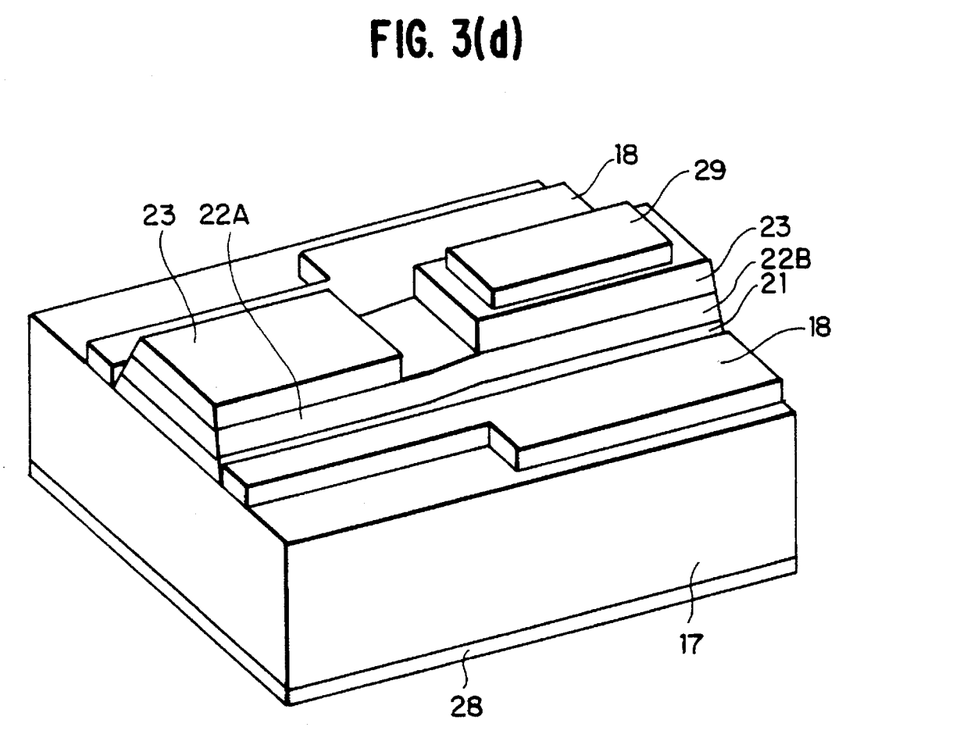
FIG. 3(d) shows a perspective view of an external appearance of an accomplished device according to the first embodiment of this invention.

Namely, as shown in FIG. 3(b), the $n^-$-InGaAsP layer 22 formed on the optical waveguide portion 20 has a composition that presents a refractive index larger than the n-type InP substrate 17, while having a sufficiently short absorption edge wavelength so that this portion of the $n^-$-InGaAsP layer 22 functions as an $n^-$-InGaAsP core layer 22A which is sufficiently low in optical loss with respect to an incident light having a long wavelength in the 1.3 to 1.5 μm band commonly employed in the ordinary optical fiber communication. On the other hand, as shown in FIG. 3(c), the n-InGaAsP layer 22 formed on the photodiode portion 19 has a composition that presents an absorption edge wavelength longer than that of the core layer 22A so that this portion of the $n^-$-InGaAsP layer 22 functions as an $n^-$-InGaAsP light absorption layer 22B which is sufficiently high in absorption coefficient with respect to an incident light of the above-mentioned long wavelength band. The thickness of the $n^-$-InGaAsP light absorption layer 22B is larger than that of the $n^-$-InGaAsP core layer 22A due to mass transport. It should be noted that the generation of the difference in absorption edge wavelength between the core layer 22A and the $n^-$-InGaAsP light absorption layer 22B is solely dependent on the width of the $SiO_2$ film mask 18, and that the core layer 22A and the $n^-$-InGaAsP light absorption layer 22B are simultaneously and integrally formed in a single epitaxial growth step. It should also be noted that a transition layer having an intermediate composition and thickness is formed in between the core layer 22A and the $n^-$-InGaAsP light absorption layer 22B.

Subsequently, a portion of the p+-InP upper clad layer 23 disposed over the transition region between the photodiode portion 19 and the optical waveguide portion 20 is selectively etched off for effecting device isolation. N-side electrode 27 and p-side electrode 29 for the photodiode are formed to complete a semiconductor optical waveguide-integrated light-receiving device according to this invention, as shown in FIG. 3(d).

Figure 4:
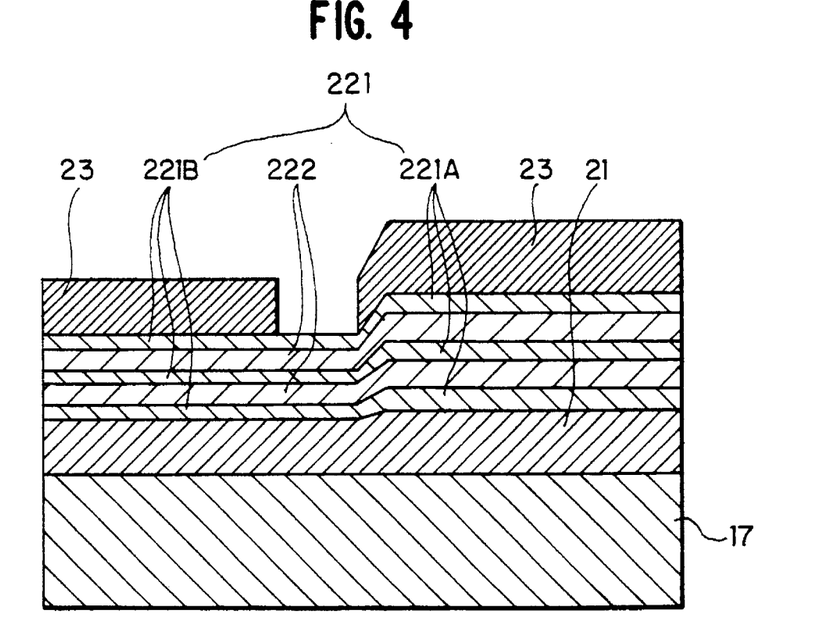
FIG. 4 is a sectional view illustrating a second embodiment of the present invention.

Next, a second embodiment of this invention will be explained referring to FIG. 4. In this embodiment, a Multiple Quantum Well (MQW) layer is employed for the $n^-$-InGaAsP core layer 22A and the $n^-$-InGaAsP light-absorbing layer 22B. This MQW layer is composed of periodically repeated layers of InGaAsP well layers 221 and InP barrier layers 222, and the equivalent refractive index of this MQW layer is made higher than that of the n-type InP substrate 17. It is possible to fabricate layers 221A and 221B which are disposed respectively on the photodiode portion and the optical waveguide portion, with different composition and thickness merely by varying the width of the SiO$_2$ mask as was done in the case of the first embodiment. The manufacturing processes of this semiconductor optical waveguide-integrated light-receiving device according to this invention are the same as those employed in the first embodiment explained above except that the MQW layer is grown as the n$^-$-InGaAsP core layer 22A and the n$^-$-InGaAsP light-absorbing layer 22B.

Figure 5:
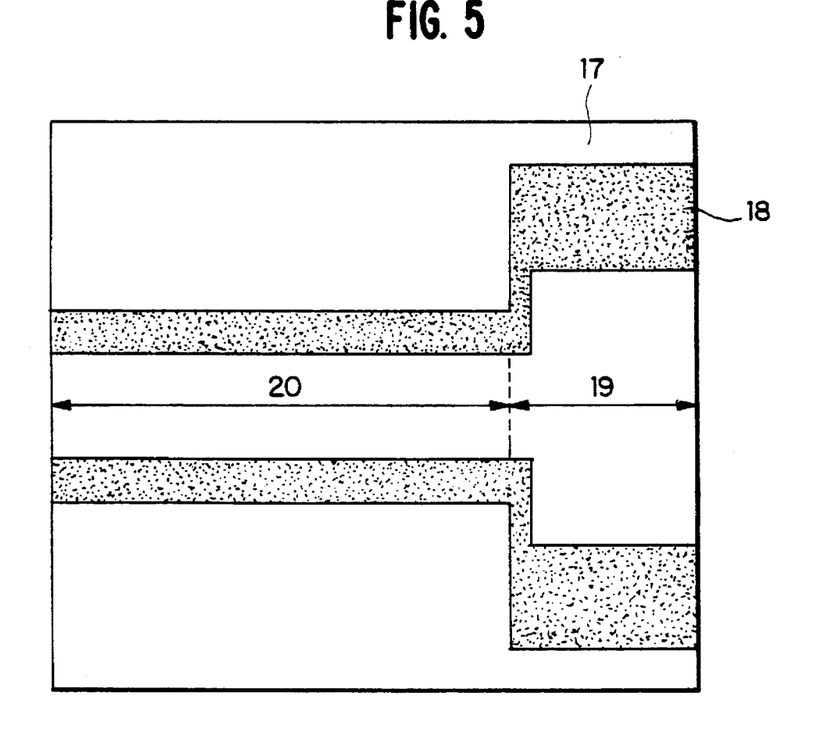
FIG. 5 is a plan view illustrating a third embodiment of the present invention.

Next, a third embodiment of this invention will be explained referring to FIG. 5 which shows a mask pattern for selective growth formed on the top surface of a substrate. This mask pattern differs from the mask pattern shown in FIG. 3(a) in that the width of the striped opening set for selective growth of the photodiode portion 19 is made larger than that of the optical waveguide, and that the length in the optical waveguiding direction of the photodiode portion 19 is made shorter than that shown in the first embodiment of this invention. Due to this enlargement in width of the photodiode portion, the optical confinement factor in the direction parallel to the epitaxial layers can be increased up to nearly 100% thereby enabling to shorten the absorption length required in the light absorbing layer, and thus making it possible to attain a sufficient quantum efficiency even with a compact device having shortened device lengths.

Subsequently, as in the cases of the first and second embodiments, a portion of the p+-InP upper clad layer 23 disposed over the transition region between the photodiode portion and the optical waveguide portion is etched off. N-side electrode 27 and p-side electrode 29 for the photodiode are formed to complete a semiconductor optical waveguide-integrated light-receiving device according to this invention.

Figure 6A:
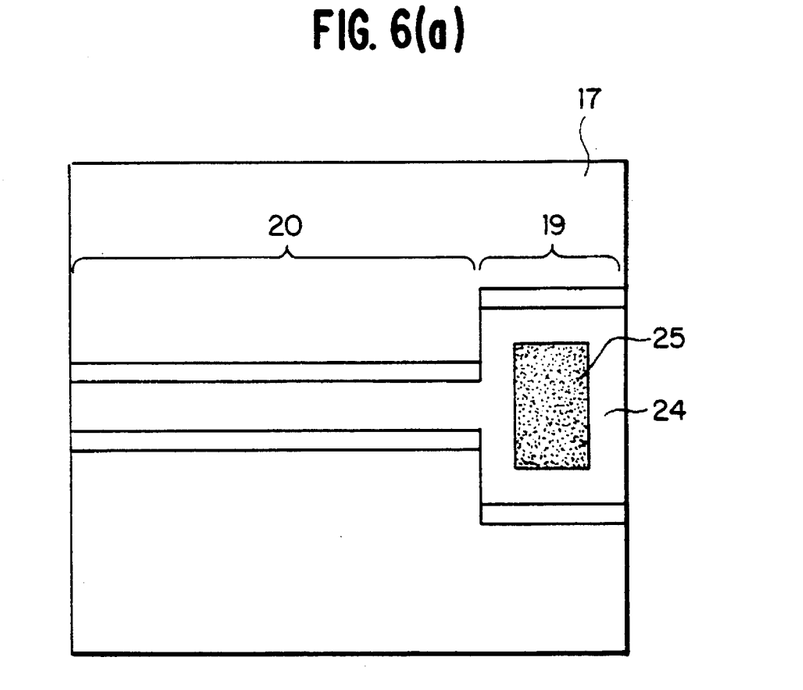
FIG. 6(a) shows a top surface of substrate of an device.
Figure 6B:
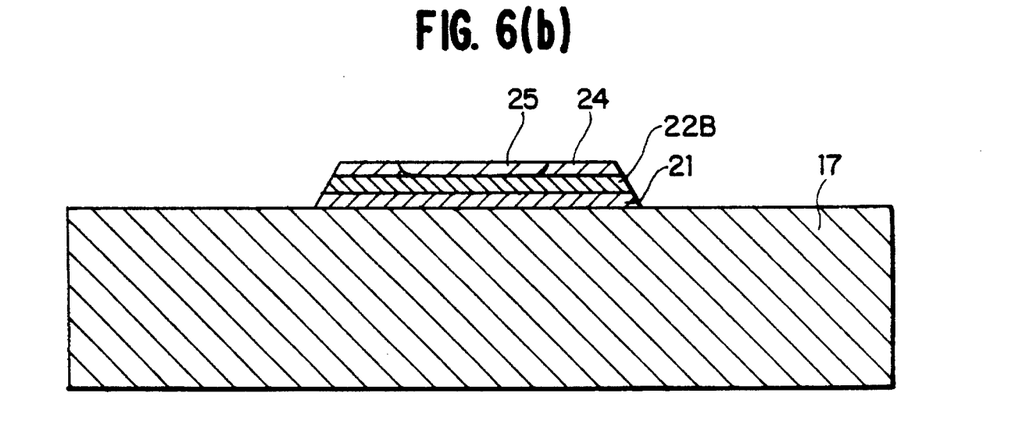
FIG. 6(b) shows a sectional view of a photodiode portion of an device.

Further, a fourth embodiment of this invention will be explained referring to FIG. 6. This embodiment differs from the third embodiment in that an n$^-$-InP upper clad layer 24 (2×10 cm$^{-3}$) is grown in place of the p$^+$-InP upper clad layer 23 during the step of the selective growth, and a portion of the n$^-$-InP upper clad layer 24 on the photodiode portion 19 is inverted through a selective thermal diffusion of Zn into a p$^+$region 25 (FIG. 6(a) and FIG. 6(b)). Subsequently, electrodes are formed on the resultant device structure thereby realizing a semiconductor optical waveguide-integrated light-receiving device according to this invention.

Figure 7A:
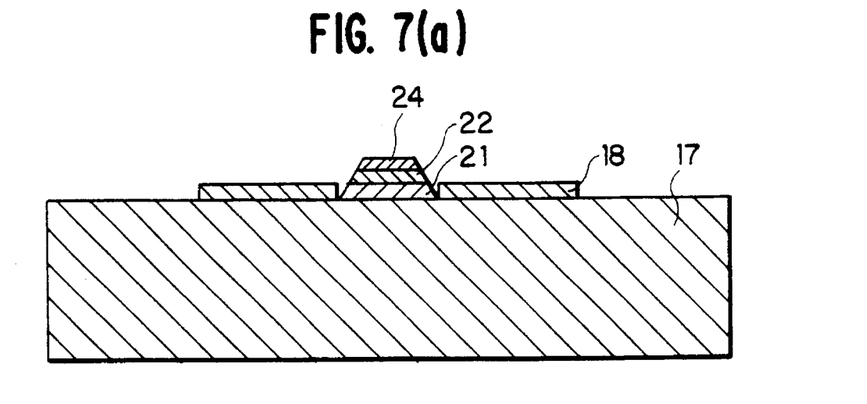
FIG. 7(a) and FIG. 7(c) show sectional views of a photodiode portion of an device.
Figure 7B:
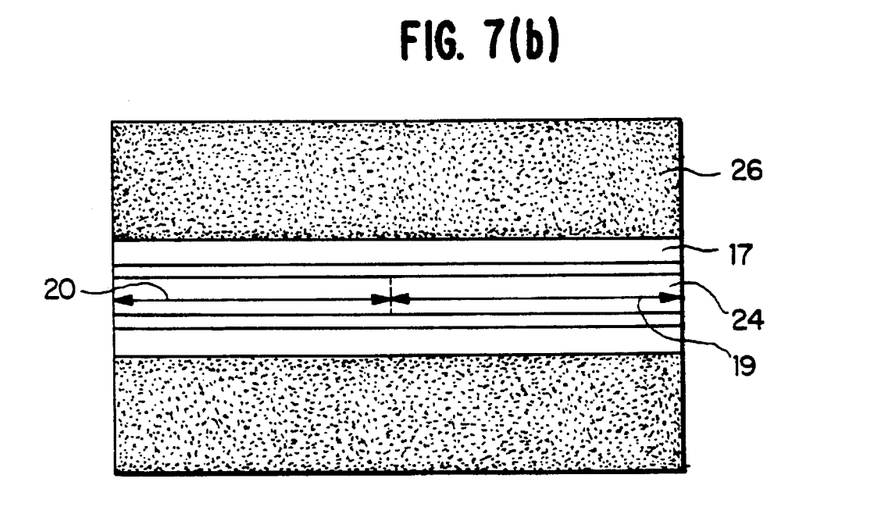
FIG. 7(b) shows a plan view of an optical waveguide portion.
Figure 7C:
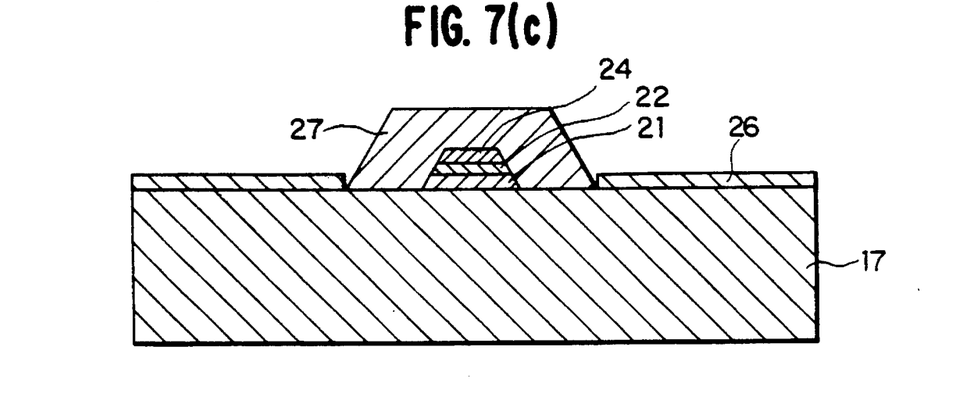
Figure 8A:
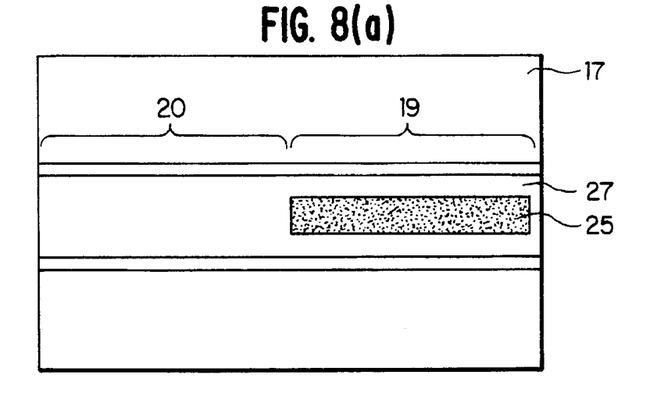
FIG. 8(a) shows a top surface of substrate of an device.
Figure 8B:
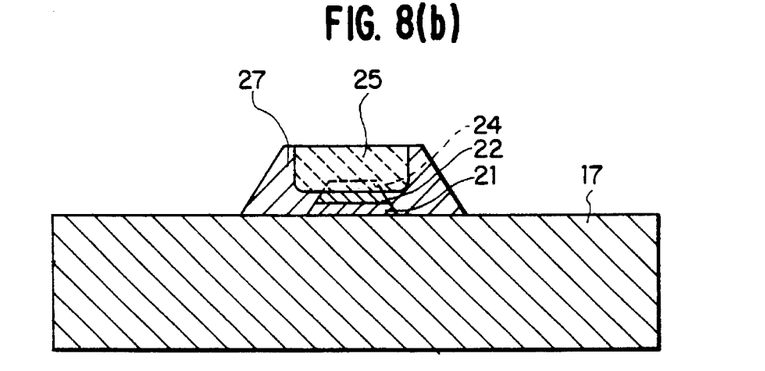
FIG. 8(b) shows a sectional view of a photodiode portion of an device.
Figure 9:
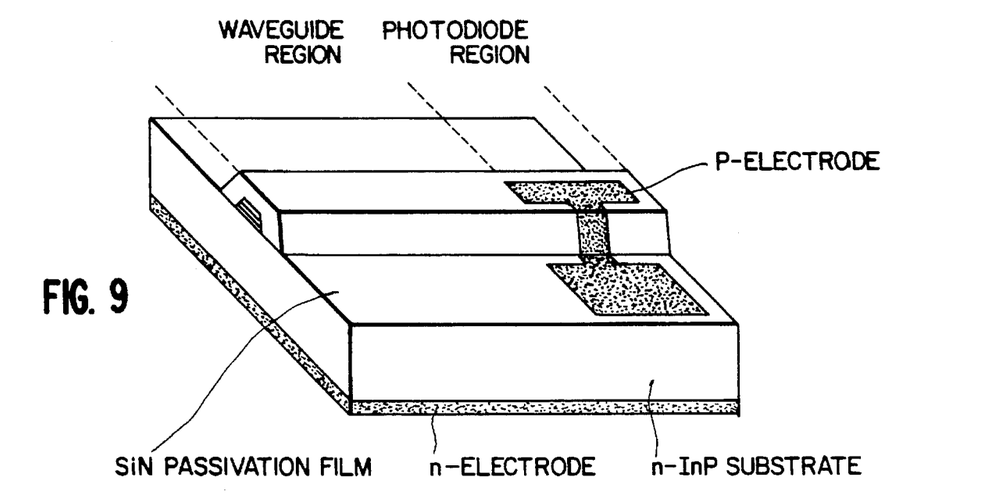
FIG. 9 is a perspective view showing an external appearance of an accomplished device according to the fifth embodiment of this invention.

Further, a fifth embodiment of this invention will be explained referring to FIG. 7. First, an n$^+$-InP lower clad layer 21, an n$^-$-InGaAsP layer 22 and an n$^-$-InP upper clad layer 24 are formed by using the mask shown in FIG. 3(a) to accomplish selective growth (FIG. 7(a)). Then, as shown in FIG. 7(b), a second mask having a larger opening for selective growth than the mask shown in FIG. 3(a) is formed by using a second SiO$_2$ film 26. Using this second mask, an n$^-$-InP burying layer 27 (2×10$^{15}$ cm$^{-3}$) is grown to embed the n$^+$-InP lower clad layer 21, the n$^-$-InGaAsP layer 22 and the n$^-$-InP upper clad layer 24 (FIG. 7(c)). Subsequently, a portion of the n$^-$-InP upper clad layer 24 as well as a portion of the n$^-$-InP burying layer 27 disposed on the photodiode portion 19 are inverted into a p-type region through a selective thermal diffusion of Zn thereby forming a p+ region 25 as shown in FIG. 8(a) and FIG. 8(b). Subsequently, electrodes are formed on the resultant device structure thereby accomplishing a semiconductor optical waveguide-integrated light-receiving device according to this invention. FIG. 9 shows an outer appearance of the accomplished device.

It is apparent from the comparison between the first example of the conventional semiconductor optical waveguide-integrated device shown in FIG. 1 and the semiconductor optical waveguide-integrated devices of this invention that in the manufacture of the conventional device, a total of three steps (if a step of forming a burying layer is included) of crystal growth processes, i.e. a crystal growth for a photodiode, a crystal growth for an optical waveguide and a crystal growth for the burying layer are required, whereas in the case of this invention, since the crystal layers for a photodiode and an optical waveguide are grown simultaneously, only two steps (even if a step of forming a buried layer is included) of crystal growth are required thus reducing the number of manufacturing steps.

Further, in the case of the conventional device shown in FIG. 1, a regrown interface is introduced at the butt-coupling portion between the optical waveguide and the photodiode, thus giving rise to the scattering and reflection of incident light in the vicinity of this regrowth interface, thereby setting forth a problem of lowering coupling efficiency between the optical waveguide and the photodiode. However, in the case of this invention, since the crystal layers for a photodiode and an optical waveguide are grown simultaneously and integrally, the generation of such a regrowth interface is avoided so that a very high coupling efficiency can be obtained.

It is also apparent from the comparison between the second example of the conventional semiconductor optical integrated device shown in FIG. 2 and the semiconductor optical integrated device of this invention that in the conventional device, since the optical waveguide and photodiode are optically coupled through an evanescent field, the confinement of light within the optical absorbing layer is rather weak so that to attain a sufficient quantum efficiency, a length of several hundreds microns in the optical waveguiding direction is generally required for the photodiode portion. This causes an increase in electric capacity as well as in the dark current thereby deteriorating the performance of the device. Whereas in the case of this invention, since the crystal layers for a photodiode and an optical waveguide are grown simultaneously and integrally, the confinement of light within the optical absorbing layer is very strong so that it possible to attain a sufficient quantum efficiency even with a compact short length device.

Further, according to the second embodiment of this invention in which an MQW layer is employed as a light-absorbing layer of the photodiode as well as a core layer of the optical waveguide, the InGaAsP well layers 221 grow thicker on the photodiode portion, shifting the absorption edge wavelength toward a longer wavelength in the absorbing layer due to the lowering of a quantum level energy of the well layer. Thus high quantum efficiency is achieved in this photodiode. In the core layer of the optical waveguide portion, on the other hand, the absorption edge wavelength is caused to shift toward a wavelength shorter than in the light-absorbing layer due to rise in the quantum level, thus further reducing the absorption loss of the guided light.

According to the third embodiment of this invention, since the width of the photodiode is made large, it is possible to improve the confinement of light in the direction parallel to the epitaxial layers (horizontal direction). Assuming that the absorption coefficient of the optical absorption layer is 5,000 cm$^{-1}$, and the confinement factor is 50%, an inner quantum efficiency of 99% can be achieved even in an device having a short photodiode portion, as short as 20 μm. Thus an integrated device of compact design having an excellent performance, i.e. low in capacity and in dark current is obtained.

According to the fourth embodiment of this invention, the pn junction for the photodiode is formed only on the photodiode portion through selective thermal diffusion of Zn into the n-type layer. Since a p-type layer is absent in the optical waveguide portion, the waveguide of the device that can be obtained by this fourth embodiment is free from an inter-valence band absorption and is low in optical loss.

Finally, according to the fifth embodiment of this invention, since the n⁻-InP burying layer is simultaneously formed on both the photodiode and the optical waveguide, a uniform burying layer can be obtained. Further, since the selective thermal diffusion of Zn is performed after the formation of the burying layer, the depth of the diffusion can be easily controlled. Additionally, since the burying layer is formed of an InP layer, the confinement of light in the optical waveguide portion is weakened so making it possible to meet the single mode condition so that an integrated device which is suitable for integration with a single mode optical device such as a directional coupler can be easily obtained.

Although the preferred embodiments have been described in the above, this invention is not limited to these embodiments, and various modifications of the disclosed embodiments are possible within the true scope of the invention. For example, The light-receiving device of the present invention is not limited to a pn-photodiode but may be a p-i-n type photodiode or an avalanche photodiode. Further, the semiconductor material to realize this invention may be selected from other III–V compound semiconductors such as InGaAs, InAlAs, InAlGaAs, GaAs, AlGaAs, GaInP, AlGaInP, GaAsSb, InAsSb, AlAsSb, etc, and likewise other II–VI compound semiconductors.

What is claimed is:

1. A semiconductor optical waveguide-integrated light-receiving device comprising;

a waveguide-type light-receiving device portion and a passive waveguide portion, said waveguide-type light-receiving device containing a light-absorbing layer, and being connected to a distal end of said passive waveguide, said waveguide-type light-receiving device portion and said passive waveguide device portion both comprising a semiconductor multi-layered waveguide structure having at least a core layer and a clad layer formed on a semiconductor substrate in the mentioned order, said multi-layered waveguide being continuously formed without said core layer being interrupted at the connecting portion between said passive waveguide and said waveguide-type light-receiving device, wherein an absorption edge wavelength of said core layer of said waveguide-type light receiving device is made longer than the absorption edge wavelength of said core layer of said passive waveguide so as to absorb light incident into said waveguide-type light receiving device.

2. The semiconductor optical waveguide-integrated light-receiving device according to claim 1, wherein said waveguide-type light receiving device constitutes a photodiode wherein said core layer of the waveguide-type light receiving device is utilized as a light absorbing layer.

3. A semiconductor optical waveguide-integrated light-receiving device comprising;

a waveguide-type light-receiving device portion and a passive waveguide portion, said waveguide-type light-receiving device containing a light absorbing layer, and being connected to a distal end of said passive waveguide, said waveguide-type light-receiving device portion and said passive waveguide device portion both comprising a semiconductor multi-layered waveguide structure having at least a core layer and a clad layer formed on a semiconductor substrate in the mentioned order, said core layer being formed of multiple quantum wells constituted by a multi-layered film comprising a plurality of semiconductor layers, said plurality of semiconductor layers having a composition different from one another, said multi-layered waveguide being continuously formed without said core layer being interrupted at the connecting portion between said passive waveguide and said waveguide-type light-receiving device, wherein an absorption edge wavelength of said core layer of said waveguide-type light receiving device is made longer than the absorption edge wavelength of said core layer of said passive waveguide so as to absorb light incident into said waveguide-type light receiving device.

4. The semiconductor optical waveguide-integrated light-receiving device according to claim 3, wherein said waveguide-type light receiving device comprises a photodiode wherein said core layer of the waveguide-type light receiving device is utilized as a light absorbing layer.

5. The semiconductor optical waveguide-integrated light-receiving device according to claim 1, wherein the width of said core layer of said waveguide-type light receiving device measured in a plane parallel to said waveguide layers is larger than a width of said core layer of said passive waveguide measured in the same direction.

6. The semiconductor optical waveguide-integrated light-receiving device according to claim 5, wherein said waveguide-type light receiving device comprises a photodiode wherein said core layer of the waveguide-type light receiving device is utilized as a light absorbing layer.

7. The semiconductor optical waveguide-integrated light-receiving device according to claim 1, wherein said multi-layered waveguide structure is buried in a semiconductor burying layer having the same conductivity as said multi-layered waveguide structure, and wherein a p-n junction for detecting light is selectively formed after formation of said semiconductor burying layer.

8. The semiconductor optical waveguide-integrated light-receiving device according to claim 3, wherein said multi-layered waveguide structure is buried in a semiconductor burying layer having the same conductivity as said multi-layered waveguide structure, and wherein a p-n junction for detecting light is selectively formed after formation of said semiconductor burying layer.

9. The semiconductor optical waveguide-integrated light-receiving device according to claim 5, wherein said multi-layered waveguide structure is buried in a semiconductor burying layer having the same conductivity as said multi-layered waveguide structure, and wherein a p-n junction for detecting light is selectively formed after formation of said semiconductor burying layer.

10. The semiconductor optical waveguide-integrated light-receiving device according to claim 1, wherein said passive waveguide and said waveguide-type light-receiving device are selectively formed in a region surrounded by a stripe-shaped mask formed on said semiconductor substrate.

11. The semiconductor optical waveguide-integrated light-receiving device according to claim 9, wherein said passive waveguide and said waveguide-type light-receiving device are selectively formed in a region surrounded by a stripe-shaped mask formed on said semiconductor substrate.

12. The semiconductor optical waveguide-integrated light-receiving device according to claim 11, wherein said waveguide-type light receiving device comprises a photodiode wherein said core layer of the waveguide-type light receiving device is utilized as a light absorbing layer.

* * * * *